United States Patent [19]
van Valburg et al.

[11] Patent Number: 5,557,275
[45] Date of Patent: Sep. 17, 1996

[54] ERROR-TOLERANT BINARY ENCODER

[75] Inventors: Christinus J. van Valburg, Veldhoven; Rudy J. van de Plassche, Waalre, both of Netherlands

[73] Assignee: U.S. Philips Corporation, New York, N.Y.

[21] Appl. No.: 269,812

[22] Filed: Jun. 30, 1994

[30] Foreign Application Priority Data

Jun. 30, 1993 [FR] France ........................ 93 08005

[51] Int. Cl.$^6$ .................................. H03M 1/36
[52] U.S. Cl. ............................... 341/160; 341/94
[58] Field of Search ............................ 341/94, 155, 156, 341/158, 159, 160

[56] References Cited

U.S. PATENT DOCUMENTS

| | | | |
|---|---|---|---|
| 4,270,118 | 5/1981 | Brokaw | 341/159 |
| 4,774,498 | 9/1988 | Traa | 341/159 |
| 4,870,417 | 9/1989 | van de Plassche et al. | 341/160 |
| 5,083,126 | 1/1992 | Komatsu et al. | 341/156 |
| 5,119,098 | 6/1992 | Komatsu et al. | 341/159 |

FOREIGN PATENT DOCUMENTS 0328215  8/1989  European Pat. Off. .

OTHER PUBLICATIONS van de Plassche et al., "An 8–Bit 100–MHz Full Nyquist Analog–to–Digital Converter", IEEE Journal of Solid State Circuits, vol. 23, No. 6, Dec. 1989, pp. 1338–1341.

Primary Examiner—Howard L. Williams
Attorney, Agent, or Firm—Bernard Franzblau; Laurie E. Gathman

[57] ABSTRACT

Encoder for the conversion of a signal of thermometric or cyclic type including a set of n Exclusive OR gates (X1, Xi, ..., Xn) and an encoding matrix with n rows (1 ... n) and a plurality of pairs of columns for a differential output of one bit of the binary signal, a matrix in which a row/column coupling is produced by a transistor (T). A pair of pseudo-columns of order zero is coupled to the rows in a way comparable to the coupling of the pair of columns of order 1, but by applying a cyclic shift in respect of the rank of the rows (rows of rank i of the pseudo-columns of order zero, coupled like the rows of rank (i modulo n)+1 of the columns of order 1). The bit of order zero [Bo] is obtained at the output of an additional Exclusive OR gate the inputs of which respectively receive the logic signal [Bo*] output by the pair of pseudo-columns of order zero, and the logic signal [B1] output by the pair of columns of order one.

5 Claims, 3 Drawing Sheets

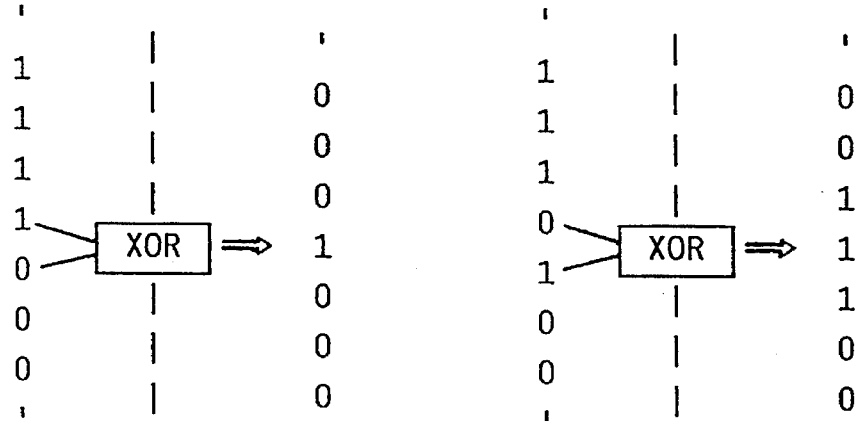
FIG.2
| (X) | [Bo*] | [B1] | [Bo]=[Bo*]⊕[B1] |
|---|---|---|---|
| 0 | 0 | 0 | 0 |
| 1 | 1 | 0 | 1 |
| 2 | 1 | 1 | 0 |
| 3 | 0 | 1 | 1 |
| 4 | 0 | 0 | 0 |
| 5 | 1 | 0 | 1 |
| 6 | 1 | 1 | 0 |
| 7 | 0 | 1 | 1 |
| 8 | 0 | 0 | 0 |
FIG.3
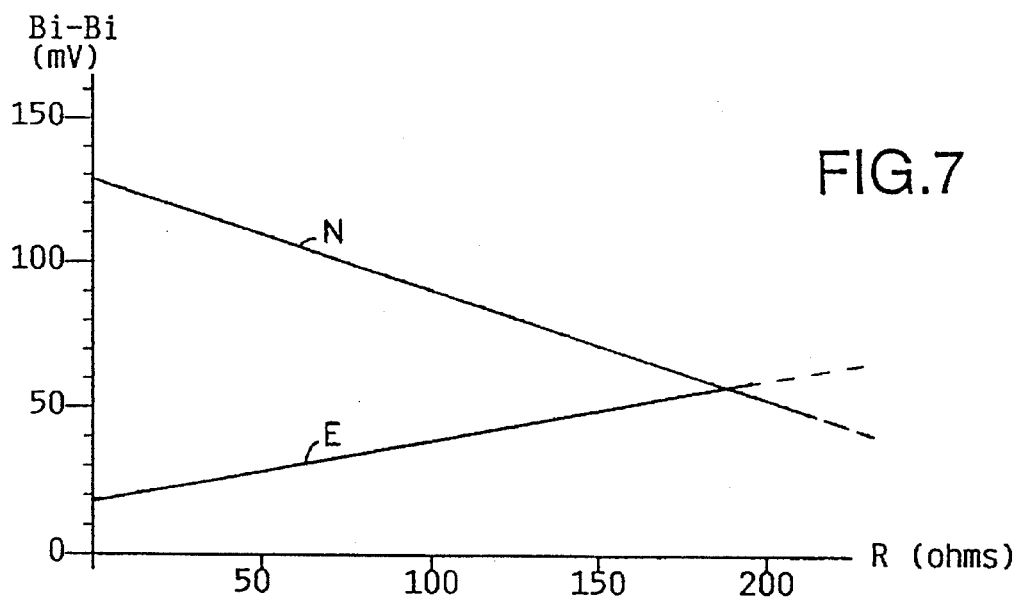
FIG.7

ERROR-TOLERANT BINARY ENCODER

BACKGROUND OF THE INVENTION

1. Field of the Invention

The present invention relates to an encoder for the conversion of a digital input signal defined as a code of thermometric or cyclic type, each bit of which is applied to an input of the encoder, so as to obtain a binary-encoded output signal, which encoder includes a set of n successive Exclusive OR gates, with two inputs and one output, each Exclusive OR gate having an input connected to an input of the gate of neighbouring rank as well as to an input of the encoder, and includes an encoding matrix with n rows at input and a plurality of pairs of columns at output, each of the n successive rows being connected to an output of one of the successive Exclusive OR gates, each of the columns being linked to a reference voltage terminal via a current source and the columns of one pair delivering a differential output for one bit of the binary output signal, in which encoding matrix active coupling between a specified row and a specified column is effected, when required, by a transistor the base of which is connected to the said specified row, the emitter of which is connected to the said specified column and the collector of which is connected to a supply voltage terminal.

2. Description of the Related Art

Such an encoder is known from the article entitled "8 bit 100 MHz full-Nyquist A/D Converter" published in IEEE Journal of Solid-State Circuits, Vol. 23, n° 6 Dec. 1988, pp. 1334–1344. A description of this encoder produced in bipolar technology is particularly described in connection with FIGS. 7 and 13 of this publication.

A major application of a binary encoder of the type indicated above is in analogue/digital converters. In this application, a well-known technical problem is posed by the presence of logic decision errors at the output of the set of Exclusive OR gates.

Measurement of the value of an analogue signal by comparison with the voltages logged on a scale of resistances ought normally to provide a thermometric digital signal, the successive bits of which contain just a single transition between a group of successive ranked-bits at 1 and a remaining group of successive ranked bits at 0. At the output of the set of Exclusive OR gates, a single output at 1 ought therefore to be noted normally.

As a result of slight imperfections in the production of the converters, decision errors are observed, particularly when the frequency of the analogue signal to be measured is increased. A decision error, hereafter called a simple error, consists in the bits of the thermometric signal observed at a given instant containing a (1 . . . 1), 0, 1, 0, (0 . . . 0) transition.

The set of Exclusive OR gates therefore yields in this case a signal at 1 on three outputs of successive ranks, instead of a single output. Other errors which are more serious since they involve more than three successive outputs from the set of gates, are also possible, but they are markedly less frequent than the so-called simple errors and ought to be avoided through more careful construction of the converter.

SUMMARY OF THE INVENTION

The aim of the present invention is to propose an encoder the particular layout of which makes it possible to correct simple decision errors automatically in an assured and rapid manner.

Indeed, according to the present invention, an encoder of the type indicated in the introductory paragraph is especially notable in that the encoding matrix includes a pair of columns respectively called pseudocolumn of order zero and complementary pseudo-column of order zero, the row/column coupling of which is derived respectively through cyclic shifting from the row/column coupling of the pair of columns of order one, namely: for a row of rank i of the pseudo-column of order zero, there is applied a coupling identical to that of the row of rank (i modulo n)+1 of the column of order one, similarly for the row of rank i of the complementary pseudocolumn of order zero, there is applied a coupling identical to that of the row of rank (i modulo n)+1 of the complementary column of order one, and in that the encoder includes an additional Exclusive OR gate with two inputs, one of which receives a logic signal corresponding to the output from the pair of pseudo-columns of order zero and the other of which receives a logic signal corresponding to the output of the pair of columns of order one, this additional Exclusive OR gate delivering at output the bit of order zero of the binary output signal.

Through an analysis, the detail of which will be set out further on, it appears that a simple decision error delivers, in respect of the bits of order greater than zero of the binary output signal, differential signals on the pairs of columns of the encoding matrix, the amplitude of which is reduced, but which are correct from the logic point of view.

The invention implements a particular structure for encoding the bit of order zero of the binary output signal, a structure such that when a simple decision error is present, the signal delivered by the pair of pseudo-columns of order zero is meaningful from the logic point of view, although of reduced amplitude. However, the pair of pseudo-columns of order zero does not directly deliver the bit of order zero of the binary output signal, but a digital signal which is to be combined through the additional Exclusive OR gate with the signal from the pair of columns of order 1.

The invention therefore allows automatic correction of simple decision errors.

According to an advantageous implementation of the invention, the encoder is characterized in that each of the pairs of columns of the encoding matrix is followed by a differential amplifier of sufficient gain to force the signal level at its output to take one of two predetermined logic levels in the presence of a simple decision error at the output of the set of Exclusive OR gates.

Signals the levels of which are raised to the standard values when a decision error is present are encountered at the output of these amplifiers.

In the case of an error, the differential signal applied to the input of the amplifiers is small, of the order of just 18 mV. It can be increased inside the encoding matrix itself in accordance with one mode of implementation of the invention, characterized in that in the encoding matrix, each transistor producing a row/column active coupling is furnished with an emitter resistor the value of which is chosen in such a way that the differential voltage level of the output from one pair of columns, in the presence of a simple decision error at the output of the Exclusive OR gates, is rendered comparable with the differential voltage level produced in the absence of such an error.

Applying this arrangement, the differential voltage level in the absence of error is nevertheless reduced by comparison with an encoding matrix the transistors of which are not furnished with an emitter resistor. A compromise is therefore desirable in regard to the choice of the value of the emitter resistors. If the differential voltage level at the output of the pairs of columns in the presence of a decision error is rendered comparable to that obtained in the absence of error, the output amplifiers of the columns of the encoding matrix can be simplified and the operation of the encoder is improved.

The invention also relates to an analogue/digital converter incorporating an encoder such as defined earlier.

BRIEF DESCRIPTION OF THE DRAWINGS

The description which follows in connection with the attached drawings, which are given by way of nonlimiting example, will clearly elucidate the substance of the invention and the manner in which it may be embodied.

FIG. 2 illustrates the case of a simple decision error as compared with the normal, error-free, situation at the output of the Exclusive OR gates.

FIG. 3 is a table illustrating in the binaryencoded output from the encoder according to the invention how the bit of order 0 is obtained from the output of the pseudo-columns of order0.

FIG. 7 represents curves of variations in the differential voltage levels produced at the output of the pairs of columns, on the one hand in the absence of error and on the other hand in the presence of a decision error, as a function of the value of an emitter resistor according to the mode of implementation described in FIG. 6.

DETAILED DESCRIPTION OF THE PREFERRED EMBODIMENTS

Figure 1:
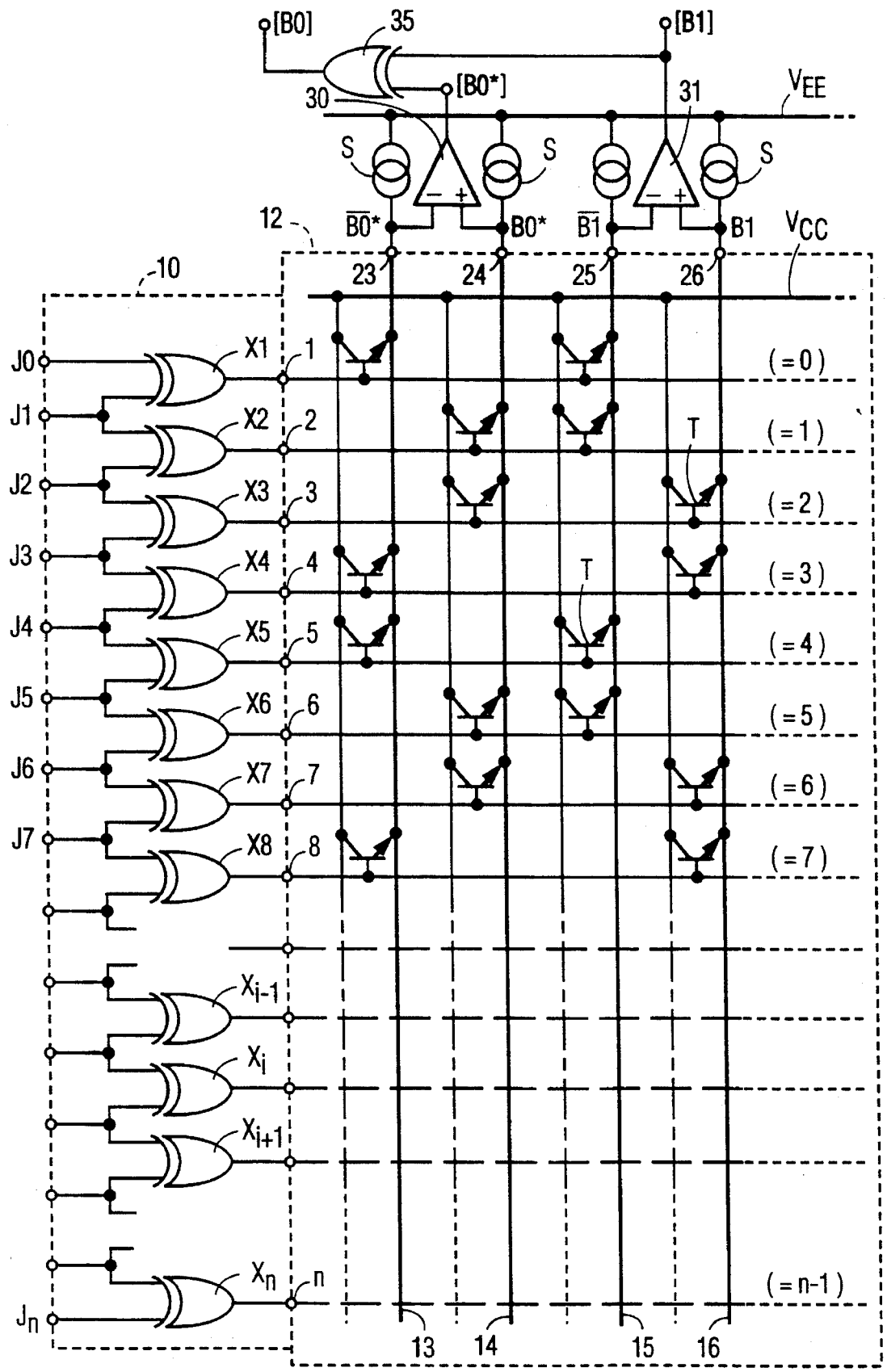
FIG. 1 represents a partial and diagrammatic view of an encoder according to the invention.

In FIG. 1 an encoder according to the invention includes a set of n Exclusive OR gates 10, each of the gates X1, X2 ... Xi ... Xn of which, of successive ranks, has two inputs and one output. Each of the gates Xi has an input connected to an input of the gate Xi−1 as well as to an input $J_i$−1 of the encoder, the other input of the gate Xi being connected to an input of the gate Xi+1 as well as to an input Ji of the encoder. The encoder further includes an encoding matrix 12, with n rows of successive ranks, each of which is connected to the output of each Exclusive OR gate Xi, and pairs of columns at output 13–14, 15–16, . . . , the number of these pairs of columns being equal to the number of bits of the signal to be encoded into binary at the output of the encoder.

Each of the columns 13, 14, 15, 16, . . . , is linked to a reference voltage terminal VEE via a current source S and the columns of a pair 13–14, 15–16, . . . , delivering a differential output 23–24, 25–26, . . . , for one bit of the binary output signal [$B_0$], [$B_1$], . . . .

In the example, the encoder is intended to deliver binary outputs ranging from the value 0 to the value (n−1).

For this purpose, the row said to be of rank 1 is in the high state for the value 0 at output, and the row of rank n is in the high state for the value (n−1) at output. To produce these conditions, the input Jo is fixed at a high level and the input Jn is fixed at a low level, permanently. When a row is active, it specifies at the output of the encoder a binary value the decimal equivalent of which is indicated between parentheses, to the right of FIG. 1.

In the encoding matrix 12, active coupling between a row and a column is effected, when necessary, by a transistor T the base of which is connected to a row, the emitter of which is connected to a column and the collector of which is connected to a supply terminal VCC.

Thus, column 15 delivers at its output 25 a signal $\overline{B1}$ this column being coupled for this purpose to the rows with ranks 1, 2, 5, 6, . . . . In analogous fashion, column 16 delivers at output 26 a signal B1 and it is coupled to the rows with ranks 3, 4, 7, 8, . . . .

The signals B1 and $\overline{B1}$ are applied to the input of a differential amplifier 31 delivering at output a signal [B1] corresponding to the bit of order 1 of the binary output from the encoder.

The column pair 13 and 14 is called a pair of pseudo-columns of order 0 because it is coupled to the output rows of the set of Exclusive OR gates 10 by cyclic shifting from the row/column coupling of the pair of columns 15, 16 of order 1.

Thus the coupling of column 13 is derived from the coupling of column 15 but carrying this coupling over to a row with immediately lower rank. Column 14 is similarly coupled to the output rows of the set of Exclusive OR gates 10 in a manner comparable to the coupling of column 16 but carrying this coupling over to rows with immediately lower ranks. To clarify the coupling of the pseudo-columns of order 0 with the rows with extreme ranks, this coupling can be expressed by saying that for a row of rank i of the pseudo-columns of order 0, a coupling identical to that of the row of rank (i modulo n)+1 of the columns of order 1 is applied. The pair of pseudo-columns 13 and 14 delivers at output, 23 and 24 respectively, the signals $\overline{B0}$* and B0*. These signals are applied to the input of a differential amplifier 30 the output of which presents a signal [Bo*] which does not correspond to the output bit of order 0 of the binary signal, but which can be derived therefrom. An additional Exclusive OR gate 35, to the input of which are applied the signals [Bo*] and [B1], actually delivers the sought-after signal [Bo].

As will be seen in more detail hereafter, such an encoder makes it possible to correct decision errors at the output of the set of Exclusive OR gates 10 automatically and rapidly.

What is meant by a simple decision error at the output of the set of Exclusive OR gates 10 will now be clarified with the aid of FIG. 2. In accordance with the left-hand part of this figure, the successive input signals are combined by Exclusive OR (XOR) gates so as to deliver at output a logic signal normally yielding a single 1 state which corresponds to the transition between the successive inputs in the 1 state and the succeeding inputs in the 0 state.

In the right-hand pan of FIG. 2 is indicated a series of states at the input of the set of Exclusive OR gates 10, the transition of which between the 1 state and the 0 state contains three successive changes from the 1 state to the 0 state, then from the 0 state to the 1 state and finally from the 1 state to the 0 state. These three transitions at input deliver, at the output of the Exclusive OR gates, three successive 1 states instead of just one. It will be granted that in the absence of error, the only output row in the 1 state ought to be that which is centred between the two error rows themselves at 1. This type of error is called a "simple decision error" since it concerns only three rows with successive ranks whereas other more significant errors would involve more than three successive rows. However, the so-called simple decision errors are aim the most frequent especially when the frequency of the signal to be measured is increased.

The table of FIG. 3 shows how the encoder according to the invention makes it possible to obtain the bit of order [Bo] of the binary output from the value [Bo*] output by the pair of pseudo-columns of order 0 and from the bit [B1] of the binary output of order 1. In the column denoted by (X) are listed the successive decimal values represented by the successive rows when they are in the high state. These decimal values are also indicated in FIG. 1, between parentheses. Column [Bo*] represents the corresponding states of the differential signal output by the pair of pseudo-columns of order 0, the column denoted [B1] indicates the successive states of the binary output of order 1 and column [Bo] indicates the state obtained through the relation [Bo]=[Bo*]⊕[B1].

We note in this table that by passing through the additional Exclusive OR gate 35 a suitable output of the bit [Bo] of the binary output is indeed obtained.

Figure 4:
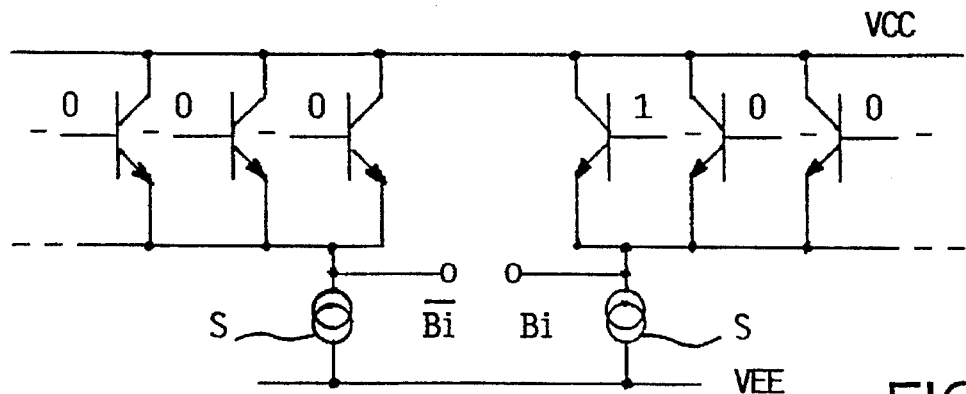
FIGS. 4 and 5 show diagrams illustrating respectively the situation of normal encoding and of encoding in the presence of a decision error.
Figure 5:
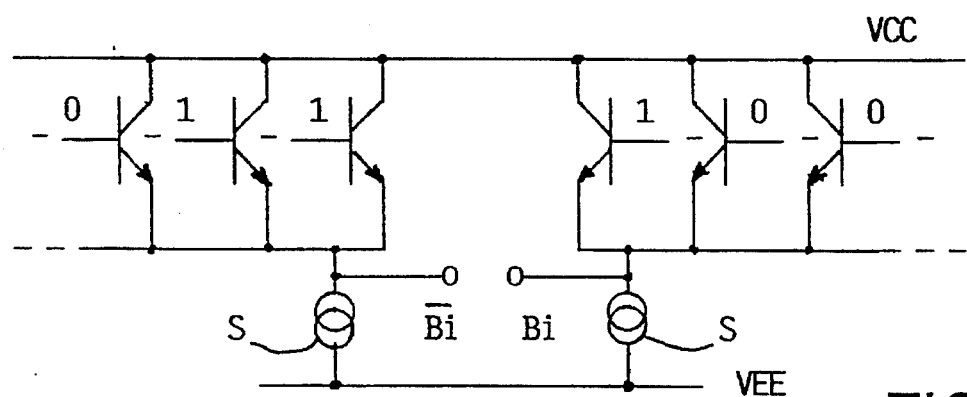

FIGS. 4 and 5 will make it possible to evaluate the differential voltage disparity produced on the columns, on the one hand during a normal measurement, and on the other hand in the presence of a simple decision error. These figures show, diagrammatically, the outputs Bi and $\overline{Bi}$ from a pair of columns Bi. A pair of columns of order i includes n coupling transistors divided into half for the column of order i and into half for the complementary column of order i.

In the absence of error (as indicated in FIG. 4) just one of the coupling transistors has its base carried to the high state and all the other coupling transistors have their base carried to the low state. The states are represented by the digits 1 and 0 in the figures. The differential signal Bi-$\overline{Bi}$ can therefore be evaluated as follows:

$$Bi-\overline{Bi}=V_1-V_{BE(Io)}-Vo+V_{BE(2Io/n)}$$

where Io is the current drawn from each of the current sources S, $V_1$ and Vo are the levels of the voltages for the high logic state and low logic state respectively of the n rows.

We write $V_1-V_o-V_{SW}$; it follows:

$$Bi-\overline{Bi}=V_{SW}-V_TLn(n/2) \quad (1)$$

a relation in which $V_T = \frac{kT}{q} \approx 26$ mV at 300° K.

k=Boltzmann's constant
T=absolute temperature
q=electron charge.

In formulating relation (1), the current contribution engendered by the transistors the base of which is in the low state, competing with the single transistor the base of which is in the high state, has been neglected.

In the case of a simple decision error, three transistors have their base in the high state. When this involves a pair of columns of order i larger than 1, it may happen that the three transistors the base of which is in the high state are on the same side, either on the Bi side, or on the $\overline{Bi}$ side. This case affords no kind of difficulty for the output of the signal Bi-$\overline{Bi}$ because this signal is at a slightly different level (slightly higher) than that indicated by relation (1).

On the other hand, FIG. 5 relates to the case where, following a simple decision error, two transistors are active in the column $\overline{Bi}$ and one only in column Bi. It is readily seen with the aid of FIG. 1 and 2 that the transistor, which would have been active in the absence of decision error, must be located on the side where two transistors are active simultaneously. The voltage disparity Bi-$\overline{Bi}$ ought therefore to be negative in the example. The following calculations will show that this is actually the case, but the signal obtained is of very low amplitude. With the same notation as before, we can write:

$$Bi-\overline{Bi}=V_1-V_{BE(Io)}-V_1+V_{BE(Io/2)}$$

which gives:

$$Bi-\overline{Bi}=V_TLn(\frac{1}{2})=-V_TLn(2) \quad (2)$$

or around −18 mV.

Such a signal is therefore correct as regards the sign, and once amplified by the amplifier such as 30, 31, ..., visible in FIG. 1, this signal can be converted into a signal with a standard logic level. Referring again to FIG. 1, it can be observed that the coupling between row and column for the pair of pseudo-columns of order 0 is performed in a manner analogous to the pair of columns of order 1, that is to say with a coupling of consecutive rows and then two uncoupled rows, for each column. The pseudo-columns of order 0 behave in accordance with the example of FIG. 5.

It has already been seen with the aid of FIG. 3 that in the absence of decision error, the pseudo-columns of order 0 make it possible to obtain an output of the appropriate bit of order 0 of the binary output. In short, in the presence of a simple decision error the encoder according to the invention delivers at output a correct bit of order 0.

Figure 6:
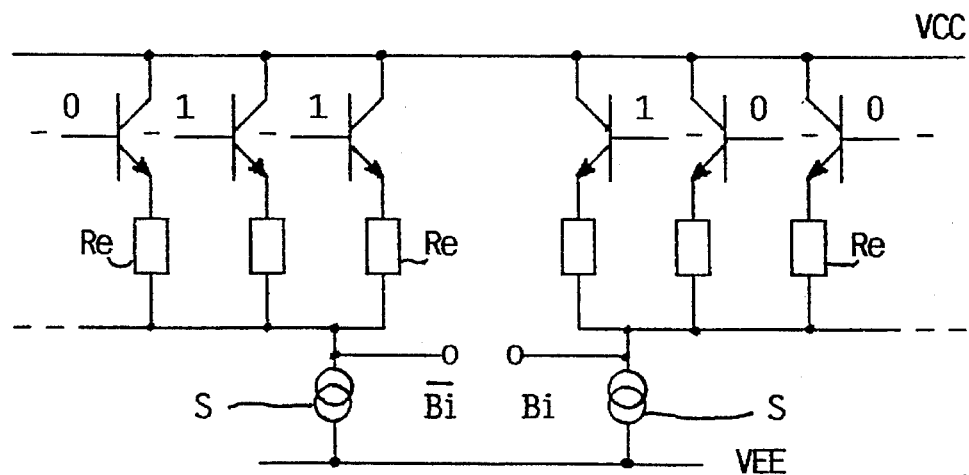
FIG. 6 shows the diagram of a particular embodiment of the invention.

FIG. 6 represents an embodiment of the invention in which a resistor Re is inserted between the emitters of the transistors and the columns. Through this arrangement it is possible to increase the differential voltage level produced on the columns when a decision error is present. However, in this mode of implementation, the differential voltage level produced on the columns, in the absence of error, is reduced correspondingly.

In the absence of decision error we may write:

$$Bi-\overline{Bi}=V_1-V_{BE(Io)}-R.Io-[VO-V_{BE(2Io/n)}-R.2Io/n]$$

with R=value of the resistor Re; or again:

$$Bi-\overline{Bi}=V_{SW}-V_TLn(n/2)-R.Io(1-2/n) \quad (3)$$

The voltage disparity Bi-$\overline{Bi}$ is reduced by the value: R.Io (1−2/n) relative to the case where the emitter resistor is omitted.

In the case of a decision error we may write:

$$Bi-\overline{Bi}=V_1-V_{BE(Io/2)}-R.Io/2-[V_1-V_{BE(Io)}-R.Io]$$

or again:

$$Bi-\overline{Bi}=-(V_TLn(2)+RIo/2) \quad (4)$$

In absolute value, the voltage disparity is increased by RIo/2 as compared with relation (2).

FIG. 7 shows the curve of voltage disparity Bi-$\overline{Bi}$, in absolute value, on the one hand in the normal case -curve N-, and on the other hand in the presence of a simple decision error -curve E-, as the emitter resistance Re is made to vary. The following values have been used by way of example:

Io=400 µA, current drawn from the current sources S $V_{SW}$=200 mV, disparity in the logic levels output by the Exclusive OR gates n=32.

It is clear that by increasing the value of the emitter resistances Re it is possible considerably to increase the differential voltage level in the case of a simple decision error, and to render this voltage level comparable to that produced in the absence of error.

Equality between these voltage levels is obtained for a value of resistance R=around 190Ω. A voltage disparity of the order of 56 mV is then obtained in all cases, which disparity is acceptable and allows the use of differential amplifiers such as shown in FIG. 1, with the labels 30, 31, . . . , of very simplified construction.

What is claimed is:

1. Encoder for the conversion of a digital input signal defined as a code of thermometric or cyclic type, each bit of which is applied to an input of the encoder, so as to obtain a binary-encoded output signal, wherein the encoder comprises: a set of n successive Exclusive OR gates, each with two inputs and one output, each Exclusive OR gate having an input connected to an input of the gate of neighbouring rank as well as to a respective input of the encoder, and includes an encoding matrix with n rows at input and a plurality of pairs of columns at output, each of the n successive rows being connected to an output of a respective one of the successive Exclusive OR gates, each of the columns being coupled to a reference voltage terminal via a respective current source and the columns of one pair delivering a differential output for one bit of the binary output signal, in which encoding matrix active coupling between a specified row and a specified column is effected, when required, by a transistor, the base of which is connected to the said specified row, the emitter of which is connected to the said specified column and the collector of which is connected to a supply voltage terminal, wherein the encoding matrix includes a pair of columns respectively called pseudo-column of order zero and complementary pseudo-column of order zero, the row/column coupling of which is derived respectively through cyclic shifting from the row/column coupling of the pair of columns of order one, namely: for a row of rank i of the pseudo-column of order zero, there is applied a coupling identical to that of the row of rank (i modulo n)+1 of the column of order one, similarly for the row of rank i of the complementary pseudocolumn of order zero, there is applied a coupling identical to that of the row of rank (i modulo n)+1 of the complementary column of order one, and wherein the encoder includes an additional Exclusive OR gate with two inputs, one of which receives a logic signal corresponding to the output from the pair of pseudo-columns of order zero and the other of which receives a logic signal corresponding to the output of the pair of columns of order one, said additional Exclusive OR gate delivering at output the bit of order zero of the binary output signal.

2. Encoder according to claim 1, wherein each of the pairs of columns of the encoding matrix is coupled to a differential amplifier of sufficient gain to force the signal level at its output to take one of two predetermined logic levels, in the presence of a simple decision error at the output of the set of Exclusive OR gates.

3. Encoder according to claim 1, wherein in the encoding matrix, each transistor producing a row/column active coupling includes an emitter resistor, the value of which is chosen such that the differential voltage level of the output from one pair of columns, in the presence of a simple decision error at the output of the Exclusive OR gates, is rendered comparable with the differential voltage level produced in the absence of such an error.

4. Analogue/digital converter which includes an encoder according to claim 1.

5. Encoder according to claim 2, wherein in the encoding matrix, each transistor producing a row/column active coupling includes an emitter resistor, the value of which is chosen such that the differential voltage level of the output from one pair of columns, in the presence of a simple decision error at the output of the Exclusive OR gates, is rendered comparable to the differential voltage level produced in the absence of such an error.

* * * * *